(12) United States Patent
Kim

(10) Patent No.: US 11,782,084 B2
(45) Date of Patent: Oct. 10, 2023

(54) DATA GENERATION METHOD FOR REGRESSION MODELS FOR CIRCUIT ELEMENT VALUE DETERMINATION

(71) Applicant: Howard University, Washington, DC (US)

(72) Inventor: Charles J Kim, Annandale, VA (US)

(73) Assignee: HOWARD UNIVERSITY, Washington, DC (US)

( * ) Notice: Subject to any disclaimer, the term of this patent is extended or adjusted under 35 U.S.C. 154(b) by 114 days.

(21) Appl. No.: 17/364,061

(22) Filed: Jun. 30, 2021

(65) Prior Publication Data
US 2021/0405105 A1    Dec. 30, 2021

Related U.S. Application Data

(60) Provisional application No. 63/046,264, filed on Jun. 30, 2020.

(51) Int. Cl.
| | |
|---|---|
| *G01R 31/08* | (2020.01) |
| *G06F 17/17* | (2006.01) |
| *G01R 31/58* | (2020.01) |
| *G01R 31/52* | (2020.01) |

(52) U.S. Cl.
CPC ......... *G01R 31/088* (2013.01); *G01R 31/083* (2013.01); *G01R 31/52* (2020.01); *G01R 31/58* (2020.01); *G06F 17/17* (2013.01)

(58) Field of Classification Search
CPC .... G01R 31/088; G01R 31/083; G01R 31/52; G01R 31/58; G06F 17/17; G06F 17/18
See application file for complete search history.

(56) References Cited

U.S. PATENT DOCUMENTS

| | | | |
|---|---|---|---|
| 2010/0033888 A1* | 2/2010 | Dougherty | G01R 31/54 702/58 |
| 2012/0086459 A1* | 4/2012 | Kim | G01R 31/086 324/525 |
| 2017/0192047 A1* | 7/2017 | Qi | G01R 31/086 |

\* cited by examiner

*Primary Examiner* — Robert H Kim
*Assistant Examiner* — Christopher J Gassen
(74) *Attorney, Agent, or Firm* — Sughrue Mion, PLLC

(57) ABSTRACT

A method, computer program, and computer system is provided for fault detection in an electrical network. An inductance between a reference point and a fault is determined at a first time based on measuring a fault current. A resistance between the reference point and the fault may be determined at a second time based on measuring a differential of the fault current as zero. A location of the fault may be identified based on the inductance and the resistance.

20 Claims, 8 Drawing Sheets

DATA GENERATION METHOD FOR REGRESSION MODELS FOR CIRCUIT ELEMENT VALUE DETERMINATION

CROSS-REFERENCE TO RELATED APPLICATION

This application claims priority from U.S. Provisional Patent Application No. 63/046,264 (filed Jun. 30, 2020) in the U.S. Patent and Trademark Office, the entirety of which is herein incorporated by reference.

FIELD

This disclosure relates generally to field of electrical power systems, and more particularly to fault determination.

BACKGROUND

Momentary sag faults in distribution feeders may show a distinctive signature behavior with less than a few transient cycles. More often, the signature may appear for less than one cycle. The system may return to normal behavior. These signatures may include, among other things, sub-cycle faults, incipient faults, transient faults, and self-clearing faults. A self-clearing transient fault in underground cables may be caused by a water tree development inside the cable or moisture accumulation in a cable splice, which may lead to a momentary insulation breakdown followed by arc. This may, in turn, cause rapid moisture evaporation and temporary insulation recovery.

SUMMARY

Embodiments relate to a method, system, and computer readable medium for fault detection in an electrical network. According to one aspect, a method for fault detection in an electrical network is provided. The method may include determining an inductance between a reference point and a fault at a first time based on measuring a fault current. A resistance between the reference point and the fault may be determined at a second time based on measuring a differential of the fault current as zero. A location of the fault may be identified based on the inductance and the resistance.

According to another aspect, a computer system for fault detection in an electrical network is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include determining an inductance between a reference point and a fault at a first time based on measuring a fault current. A resistance between the reference point and the fault may be determined at a second time based on measuring a differential of the fault current as zero. A location of the fault may be identified based on the inductance and the resistance.

According to yet another aspect, a computer readable medium for fault detection in an electrical network is provided. The computer readable medium may include one or more computer-readable storage devices and program instructions stored on at least one of the one or more tangible storage devices, the program instructions executable by a processor. The program instructions are executable by a processor for performing a method that may accordingly include determining an inductance between a reference point and a fault at a first time based on measuring a fault current. A resistance between the reference point and the fault may be determined at a second time based on measuring a differential of the fault current as zero. A location of the fault may be identified based on the inductance and the resistance.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings.

DETAILED DESCRIPTION

Figure 1:
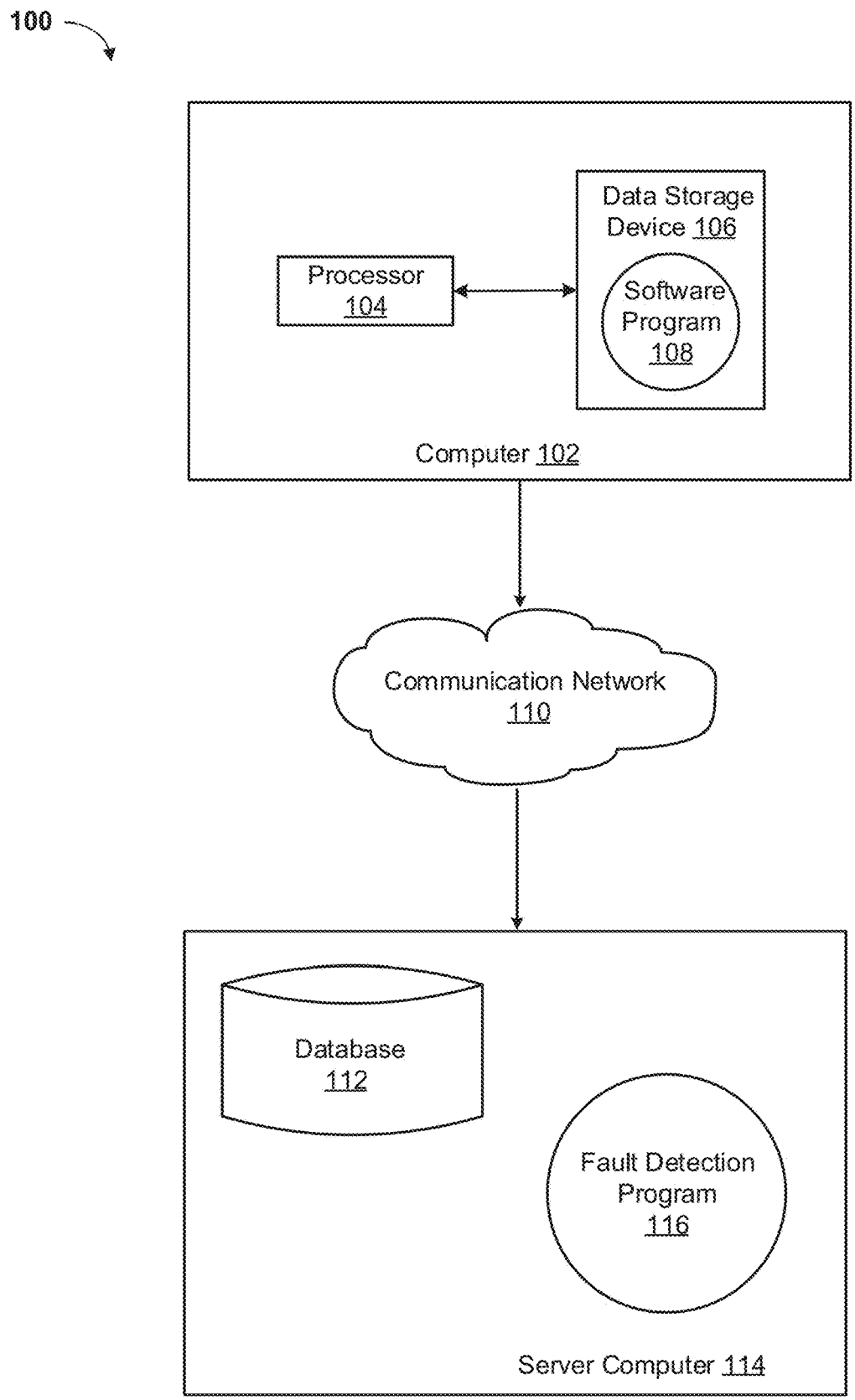
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of electrical power systems, and more particularly to fault determination. The following described exemplary embodiments provide a system, method and computer program to, among other things, determining the correct location of a self-clearing transitory fault. Therefore, some embodiments have the capacity to improve the field of computing by allowing a computer to determine fault locations and prevent permanent faults or unscheduled outages, which may eliminate costly and time-consuming fault locating methods that stress system components exposed to fault currents.

As previously described, momentary sag faults in distribution feeders may show a distinctive signature behavior with less than a few transient cycles. More often, the signature may appear for less than one cycle. The system may return to normal behavior. These signatures may include, among other things, sub-cycle faults, incipient faults, transient faults, and self-clearing faults. A self-clearing transient fault in underground cables may be caused by a water tree development inside the cable or moisture accumulation in a cable splice, which may lead to a momentary insulation breakdown followed by arc. This may, in turn, cause rapid moisture evaporation and temporary insulation recovery.

Previous approaches centered on solving for the unknown location variables (line resistance and line reactance to the fault) for a fault loop using a discrete inverse time-domain differential equation. However, these approaches ignored the resistance to the fault in the discrete inverse differential equation because there were two unknown variables in the single fault loop equation. The exclusion of the resistance to the fault in certain situations and conductor types may cause unacceptable error in fault location determination. It may be advantageous, therefore, to solve for the two unknowns from the single fault loop equation.

Since the equation of voltage contains two terms (i.e., the first term for resistance multiplied by fault current and the second the inductance by the differential of the fault current), a time t1 may be determined at which the fault current becomes zero. At time t1, the first term may disappear and the equation may be left with just one variable, the inductance to the fault. Similarly, a time t2 may be determined, at which the differential of the fault current becomes zero. At time t2, the second term may disappear, and the equation may be left with just one variable, the resistance to the fault.

For time periods in which the fault current does not go zero, when there may be numerous points of zero differential of fault current due to the noise in the fault current signal, and when there may be oscillation of harmonics leading to multiple points of zero differentials, a discrete parameter estimation with least squares may be used. The discrete least-squares approach may use concatenated measurement data of voltage and current signals captured at a substation which may serve multiple circuits, on one of which self-clearing faults may occur Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a fault detection system 100 (hereinafter "system") for fault detection in an electrical network. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 5 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 6 and 7. The server computer 114 may also be located in a cloud computing deployment model, such as a private cloud, community cloud, public cloud, or hybrid cloud.

The server computer 114, which may be used for detecting faults in an electrical system is enabled to run a Fault Detection Program 116 (hereinafter "program") that may interact with a database 112. The Fault Detection Program method is explained in more detail below with respect to FIG. 4. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger fault detection program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2A:
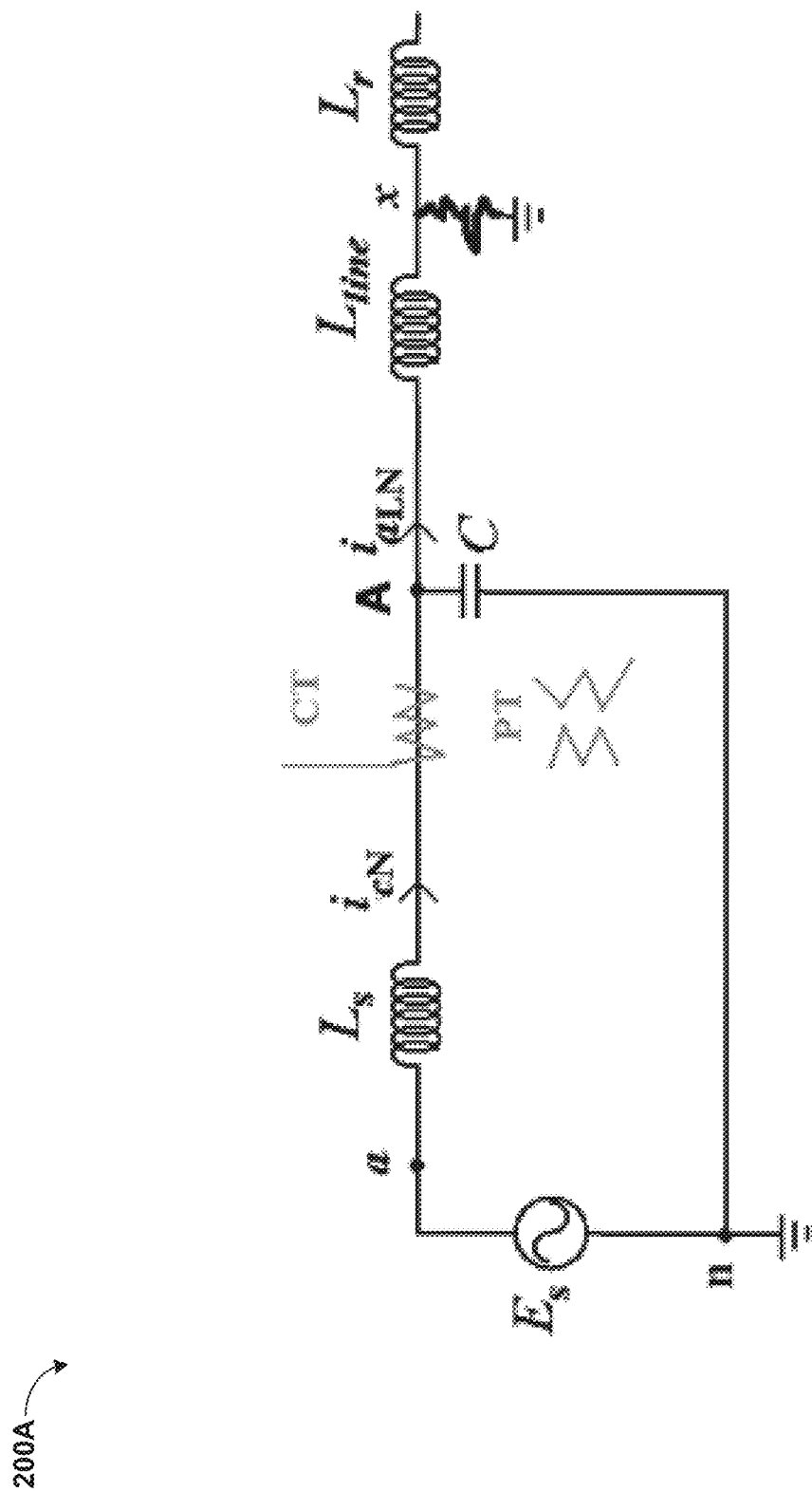
FIG. 2A is a diagram of a circuit, according to at least one embodiment.

Referring now to FIG. 2A, a circuit 200A is depicted. For example, consider a simple circuit for a single line-to-ground fault on phase A at the location x on a circuit of a substation which serves multiple circuits. The circuit 200A may include a circuit for a single line-to-ground fault on phase A with all resistive components ignored. As noted above, the resistance to the fault may be ignored. The circuit may be equivalently expressed with a sinusoidal source E with source inductance LS, substation capacitance C for power factor correction, the inductance of the circuit from the substation to the fault, Lline, and the inductance of the rest of the circuit, Lr, with all resistive components ignored. The only variables measurable at the substation, through CTs and PTs, may be the current flowing through the source impedance LS and the bus voltage, and the approach intends to calculate the inductance Lline to x by using only the two measured signals.

When the phase A self-clearing ground fault occurs at time t=0, then at that instant, the voltage at x becomes zero, which may be equivalent to injection of a negative voltage, $-V_{ax}(0)$, into the location x assuming that the normal voltage at x may be the same as the substation voltage. By the superposition principle, since the focus has to be "net fault voltage and net fault current" of the subject circuit not the entire bus, the net fault values may be obtained by the injection voltage alone.

Figure 2B:
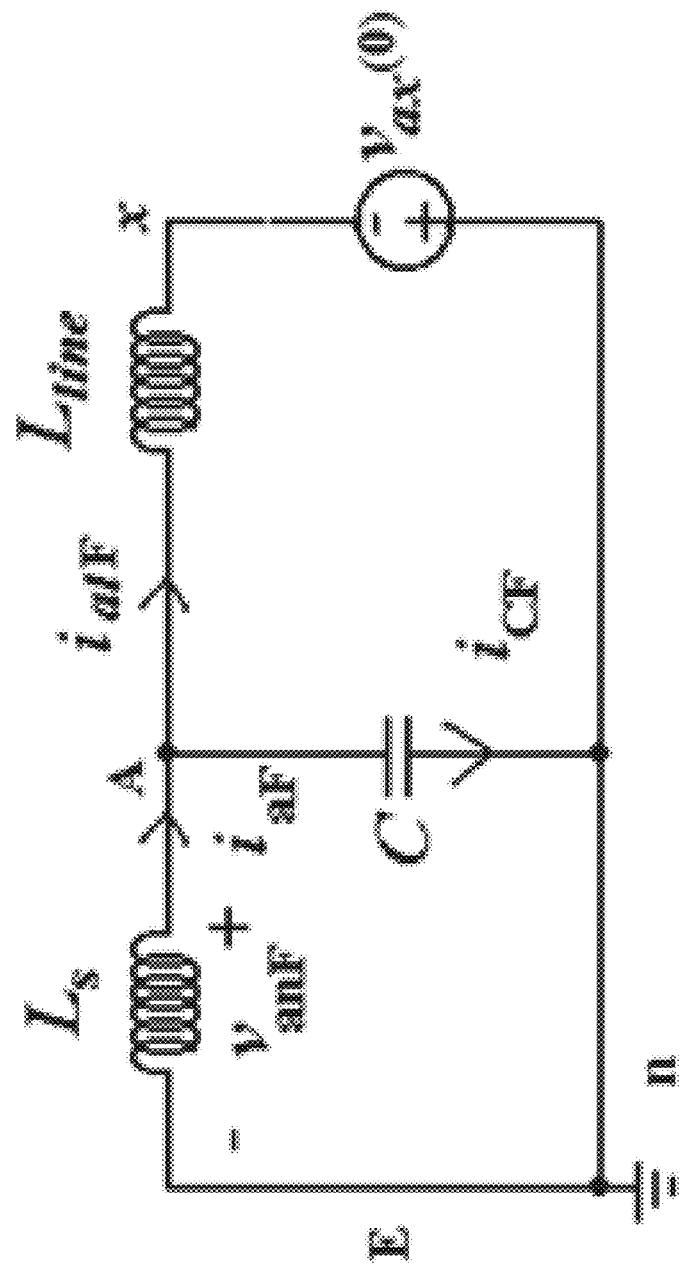
FIG. 2B is a diagram of a circuit with an injection voltage and with a source voltage deactivated, according to at least one embodiment.

Referring now to FIG. 2B, a circuit diagram 200B of a circuit with an injection voltage and with the source voltage deactivated is depicted. The variables $i_{aF}$, $i_{CF}$, $i_{alF}$, and $v_{anF}$ may be the net fault currents and voltage, respectively, contributed by the injection voltage source only. The net fault variables, $i_{aF}$ and $v_{anF}$, may be obtained by subtracting the normal, pre-fault, values from those at fault. This arrangement turns the circuit in to a transient response of injection voltage source switched on at t=0.

The inverse time-domain equation for the inductance to the fault may be given as:

$$L_{line} = \frac{-v_{anF}(t) + V_{aN}(0)}{\frac{d}{dt}i_{aF}(t) - C \cdot \frac{d^2}{dt^2}v_{anF}(t)}.$$

The value of $V_{aN}(0)$ may be assumed to be the voltage at the bus at the moment of fault initiation. Alternatively, its value can be approximated to the peak of the normal voltage, because self-clearing faults occur at the peak voltage, positive or negative.

The initial self-clearing fault location approach may be similar to solving an inverse sinusoidal transient problem. The usual transient problem may be to find transient response for a given circuit with known resistance and inductance. Inversion of the problem asks what actual values of the components may be for a given response, namely, the shape of voltage and current. In this regard, from a simple RL fault loop, from the voltage equation for the loop may be obtained as $$v(t) = R \cdot i(t) + L \cdot \frac{di(t)}{dt},$$

with measured v(t) and i(t), the inductance to the fault, L, may be determined by $$L = \frac{v(t) - R \cdot i(t)}{\frac{di(t)}{dt}}.$$

From the equation for the inductance to the fault, if the equation may be assessed at a time when the current may be zero, the R component term can be eliminated, leaving only all measured values of voltage and current. In other words, the equation may be reduced to a simplified form of:

$$L[at i(t) = 0] = \frac{v(t)}{\frac{di(t)}{dt}}.$$

Similarly, R can be determined by assessing at a time when di(t)/dt=0:

$$R\left[at \frac{di(t)}{dt} = 0\right] = \frac{v(t)}{i(t)}.$$

The weaknesses of the remedy method are: (a) no zero fault current point available in much shorter (such as less than ½ cycle) transient period; and (b) multiple current-zero points due to the noise in the fault current signal as well as oscillation of harmonic signals. The next section discusses a new method, discrete parameter estimation approach with least-squares.

Consider M scalar measurements of a signal y(t) (e.g. voltage) may be made at times, $t_{k-M}, t_{k-M+1}, \ldots, t_{k-1}, t_k$. If measurements of y(t) may be assumed to be a linear combination of 2 parameters, $\beta_0$ and $\beta_1$ (R and L) with certain parameter x(t) (e.g., current): $y(t)=x_0(t) \beta_0+x_1(t) \beta_1+v(t)$, where v(t) may be measurement errors with zero mean.

With $x=[x_0(t), x_1(t)]$ and $\beta=[\beta_0, \beta_1]$, the M measurements of y(t) can be expressed, with time $t_k$ replaced by just k for notation simplification:

$$y(k) = x(k)\beta + v(k)$$
$$y(k-1) = x(k-1)\beta + v(k-1)$$
$$\vdots$$
$$y(k-M) = x(k-M)\beta + v(k-M).$$

The above equations can be expressed by a more convenient vector form: $Y=X\beta+V$. If there are no measurement errors, then a deterministic equation may be resulted as $Y=X\beta$, and parameter $\beta$ can be solved as $\beta=X^{-1}Y$. However, if the system may be over-determined with just two variables and many more measurements, then Y may be approximated as $\hat{Y}=X\hat{\beta}$, where $\hat{\beta}$ may be obtained by the least-squares estimation method which minimizes the weighted sum of the squares of the equation error, $\check{Y}=Y-\hat{Y}$. The least-squares estimate of β may be given by $$\hat{\beta}=(X^TX)^{-1}X^TY.$$

For applying the discrete least-squares method with overly deterministic equation error, a difference equation of the fault loop may be given as:

$$v(t) = R \cdot i(t) + L \cdot \frac{i(t + \Delta t) - i(t)}{\Delta t}$$

Then rearrangement of the equation leads to, $$L \cdot i(t+\Delta t) + i(t)[R \cdot \Delta t - L] = v(t) \cdot \Delta t,$$

and eventually to a matrix equation:

$$[i(t + \Delta t) \; i(t)] \cdot \begin{bmatrix} L \\ R \cdot \Delta t - L \end{bmatrix} = [v(t)] \cdot \Delta t.$$

By including M number of measurements, the matrix expands to, $$\begin{bmatrix} i(t + M\Delta t) & \cdots & i(t + (M-1)\Delta t) \\ \vdots & \ddots & \vdots \\ i(t + \Delta t) & \cdots & i(t) \end{bmatrix} \cdot \begin{bmatrix} L \\ R \cdot \Delta t - L \end{bmatrix} = \begin{bmatrix} v(t + (M-1)\Delta t) \\ \vdots \\ v(t) \end{bmatrix} \cdot \Delta t$$

The first matrix above may be labelled as X, and the second β, and the third Y, the above equation may be written as $X \cdot \beta = Y \cdot \Delta t$, which may be the same equation as discussed in the theory of least-squares estimation. Therefrom, $$\beta = \begin{bmatrix} L \\ R \cdot \Delta t - L \end{bmatrix}$$

may be obtained by $\beta=(X^T \cdot X)^{-1} \cdot X^T \cdot Y \cdot \Delta t$.

Finally, the two parameters to the fault, L and R, may be obtained from the row components of β:

$$L = \beta_0 \text{ and } R = \frac{\beta_0 + \beta_1}{\Delta t}$$

As for the number of measurements (M) in practical application, the number of samples for ½ cycles of the signals may be used. Therefore, if the signals may be sampled at the rate of 7680 samples per second, 64 measurements may be included in the matrix formation for X and Y starting from the onset of fault. At this particular sampling rate, Δt may be 0.1302 ms.

A fault current may be generated with $$If(t) = \frac{E \cdot \cos(\omega t + \varphi)}{\sqrt{RF^2 + (\omega \cdot LF)^2}} + \left[ Iz(0) - \frac{E \cdot \cos\varphi}{\sqrt{RF^2 + (\omega \cdot LF)^2}} \right] \cdot e^{-\frac{RF}{LF}t},$$

where E may be the voltage magnitude, 12 kV, and Iz(0) may be the normal current level when the fault may be initiated.

The phase angle φ may be obtained from $$\varphi = \tan^{-1}\left(-\frac{\omega \cdot LF}{RF}\right).$$

The voltage signal may be generated using the current generated above.

$$Vf(t) = RF \cdot If(t) + LF \cdot \frac{dIf(t)}{dt} = RF \cdot If(t) + LF \cdot DI(t),$$

where, $$DI(t) = -\frac{E \cdot \omega \cdot \sin(\omega t + \varphi)}{\sqrt{RF^2 + (\omega \cdot (LS + LF))^2}} -$$

$$\frac{RF}{LS + RF} \left[ Iz(0) - \frac{E \cdot \cos\varphi}{\sqrt{RF^2 + (\omega \cdot (LS + LF))^2}} \right] \cdot e^{-\frac{RF}{LS+LF}t}.$$

For the matrix formation for the voltage and current, the first 64 samples of the second cycle (the solid line signals) may be used to represent the first ½ cycle of the measured fault voltage and current.

Figure 3:
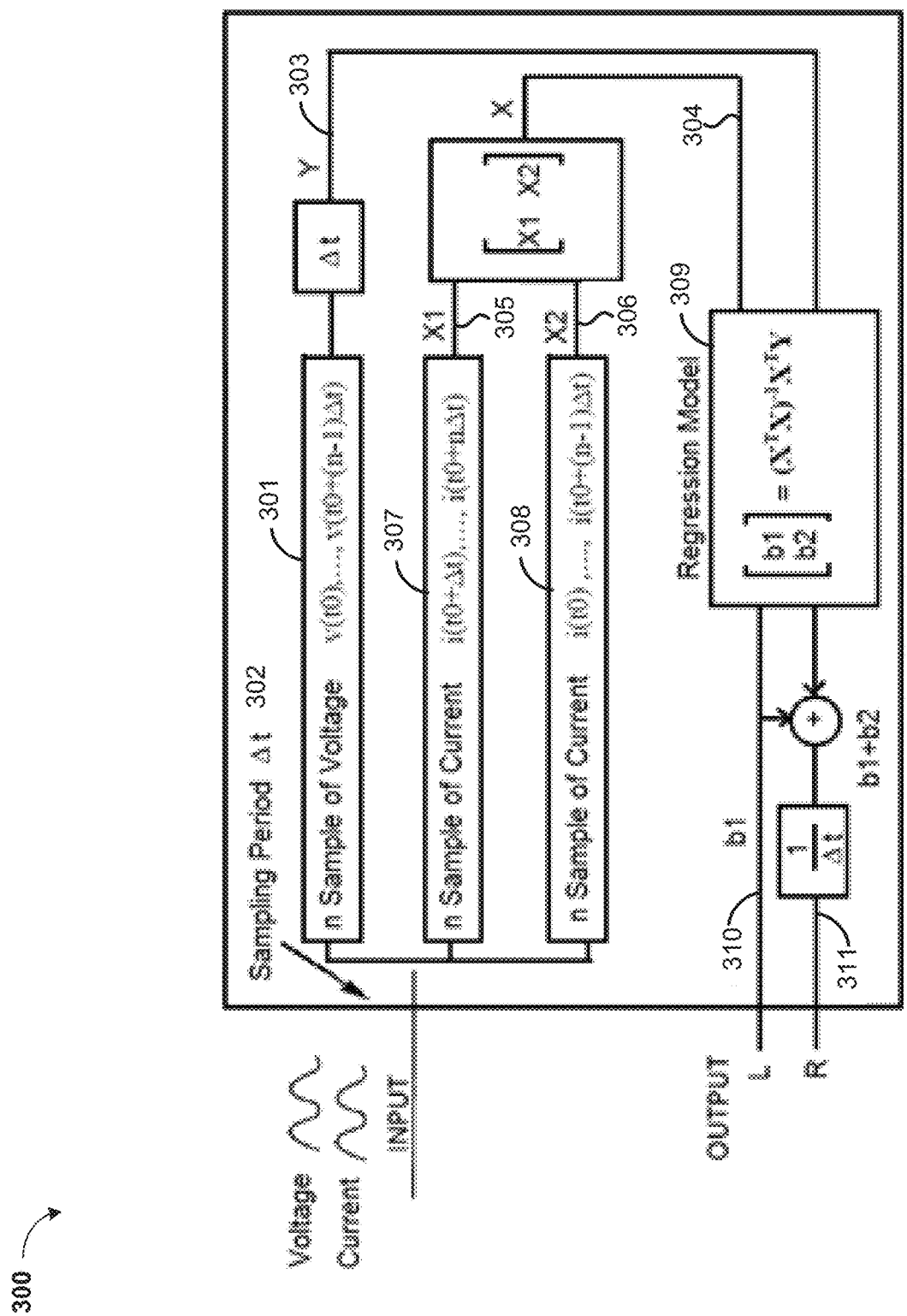
FIG. 3 is system for determining circuit element values, according to at least one embodiment.

Referring now to FIG. 3, a system 300 for determining circuit element values is depicted. According to one or more embodiments, a first matrix, with its elements obtained by the n number of sampled voltages starting at t0 and ending at (n−1)Δt 301 then each multiplied by the sampling period 302, forms the n×1 dimensional Y matrix 303. The second matrix (X 304) contains 2 columns of elements each with n rows of samples currents; the first column (X1 305) contains rows with those sampled from the time t0+Δt to t0+nΔt 307 while the second column (X2 306) may be made by those sampled from the time t0 to (n−1)Δt 308 as done for Y matrix. This 2 column matrix forms the n×2 dimensional X matrix 304 mentioned above.

The third matrix of 2×1 dimension contains the two unknowns sought to find. When the matrices X and Y thus formed by above description may be provided to a regression model 309, and the coefficient matrix b may be obtained from the regression model by $b=(X^T X)^{-1} X^T Y$ or in similar form by varieties of regression methods or algorithms. As the output of the system, the unknowns R and L may be obtained by $L=b_1$ (the first row element of the matrix b, which may be b1 310) and $R=(b_1+b_2)/\Delta t$, 311 where $b_2$, may be the second row element of the matrix b and Δt may be the sampling period.

Two matrices Y and X may be formed for ordinary regression model Y=Xb from discrete voltage and current waveforms obtained for a circuit. Unknown element values, such as resistance (R) and inductance (L) of the circuit, may be derived from b of the regression result. This derived circuit element can be used to indicate the fault location in power circuits.

When the number of rows in Y and X may be more than the elements of coefficient matrix b, which may be termed over-deterministic situation, b may be obtained by least-squares methods or their varieties in the form of $b=(X^T X)^{-1} X^T Y$ or similar varieties which find b while minimizing the error between Y and the actual measured data which corresponds to Y. $X^T$ may be the transpose of X and $(X^T X)^{-1}$ may be the inverse of $(X^T X)$.

Consider a circuit which, with its elements R and L, may be supplied by a sinusoidal source v(t). Then the equation for the voltage of the circuit may be obtained by v(t)=R*i(t)+L*di(t)/dt, where i(t) may be the circuit current and di(t)/dt may be the time derivative of the current. The time t represent a discrete time as t=0, 1, 2, . . . , n or more generally t=t0+1*Δt, t0+2*Δt, . . . , t0+n*Δt for n number of samples of v(t) and i(t), where Δt may be the sampling period and t0 may be the initial time.

The derivative part of the equation can be changed to a difference equation using the fundamental definition of time derivative as v(t)=R*i(t)+L*[i(t+Δt)−i(t)]/Δt. Then rearrangement of the equation may lead to, v(t)*Δt=L*i(t+Δt)+[R*Δt−L]*i(t).

For n-number of samples for both v(t) and i(t), there may be the following n equations:

$$v(t0)*\Delta t = L*i(t0+\Delta t) + [R*\Delta t - L]*i(t0)$$

$$v(t0+\Delta t)*\Delta t = L*i(t0+2\Delta) + [R*\Delta t - L]*i(t0+\Delta t)$$

$$v(t0+2\Delta t)*\Delta t = L*i(t0+3\Delta t) + [R*\Delta t - L]*i(t0+2\Delta t)$$

$$v(t0+(n-1)\Delta t*\Delta t = L*i(t0+n\Delta t) + [R*\Delta t - L]*i(t0+(n-1)\Delta t)$$

The above group equation can be expressed in a matrix form:

$$\begin{vmatrix} |v(t0)^*\Delta t| \\ |v(t0+\Delta t)^*\Delta t| \\ |v(t0+2\Delta t)^*\Delta t| \\ |\cdot| \\ |\cdot| \\ |v(t0+(n-1)\Delta t)^*\Delta t| \end{vmatrix} = \begin{vmatrix} |i(t0+\Delta t)i(t0)| \\ |i(t0+2\Delta t)i(t0+\Delta t)| \\ |i(t0+3\Delta t)i(t0+2\Delta t)| \\ |\cdot| \\ |\cdot| \\ |i(t0+n\Delta t)i(t0+(n-1)\Delta t)| \end{vmatrix} \begin{vmatrix} |L| \\ |R^*\Delta t - L| \end{vmatrix}$$

$$[n \times 1] \qquad [n \times 2] \qquad [2 \times 1].$$

Figure 4:
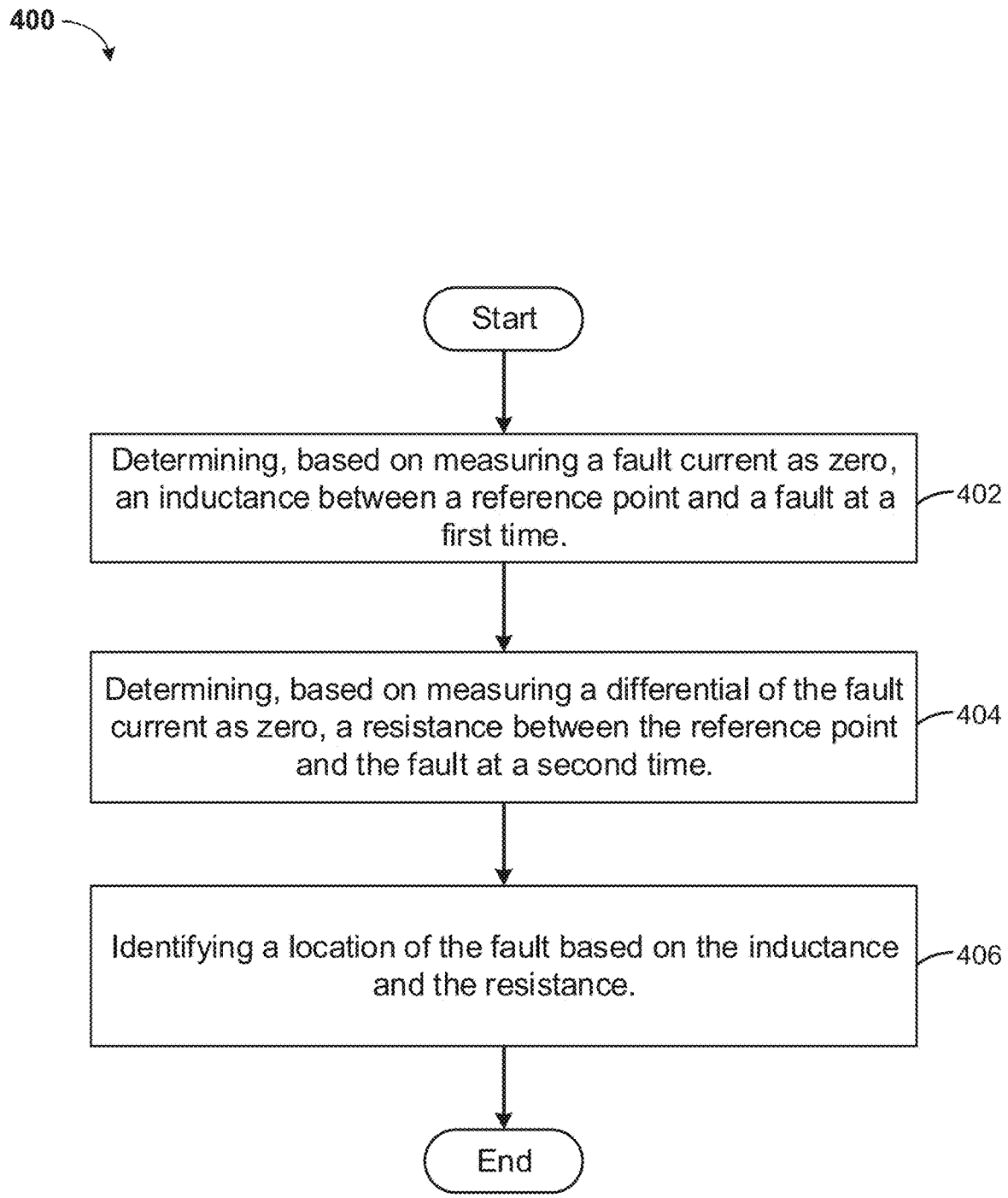
FIG. 4 is an operational flowchart illustrating the steps carried out by a program for fault detection in an electrical network, according to at least one embodiment.

Referring now to FIG. 4, an operational flowchart illustrating the steps of a method 400 carried out by a program that detects faults in an electrical network is depicted.

At 402, the method 400 may include determining, based on measuring a fault current as zero, an inductance between a reference point and a fault at a first time.

At 404, the method 400 may include determining, based on measuring a differential of the fault current as zero, a resistance between the reference point and the fault at a second time.

At 406, the method 400 may include identifying a location of the fault based on the inductance and the resistance.

It may be appreciated that FIG. 4 provides only an illustration of one implementation and does not imply any limitations with regard to how different embodiments may be implemented. Many modifications to the depicted environments may be made based on design and implementation requirements.

Figure 5:
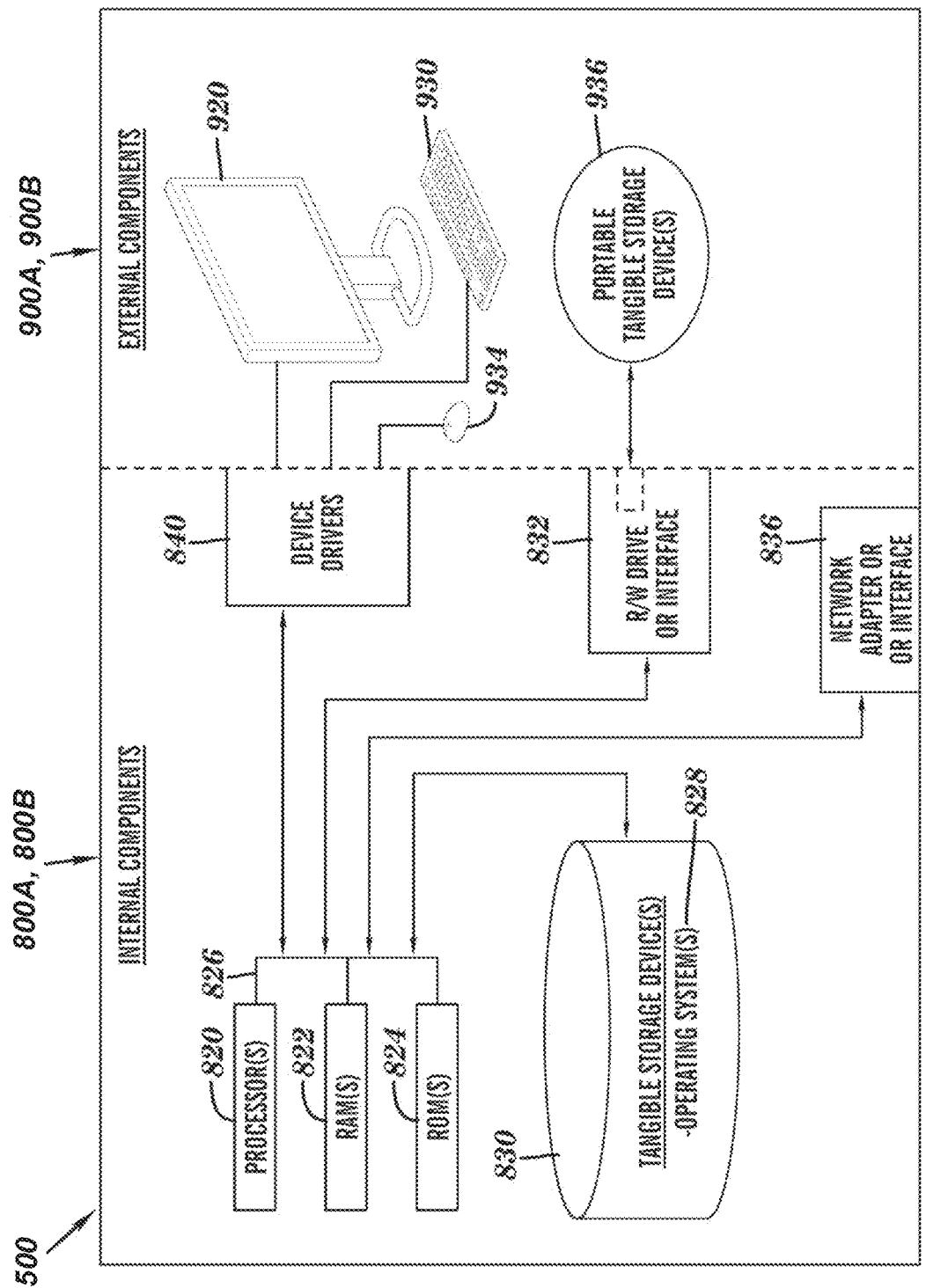
FIG. 5 is a block diagram of internal and external components of computers and servers depicted in FIG. 1 according to at least one embodiment.

FIG. 5 is a block diagram 500 of internal and external components of computers depicted in FIG. 1 in accordance with an illustrative embodiment. It should be appreciated that FIG. 5 provides only an illustration of one implementation and does not imply any limitations with regard to the environments in which different embodiments may be implemented. Many modifications to the depicted environments may be made based on design and implementation requirements.

Figure 6:
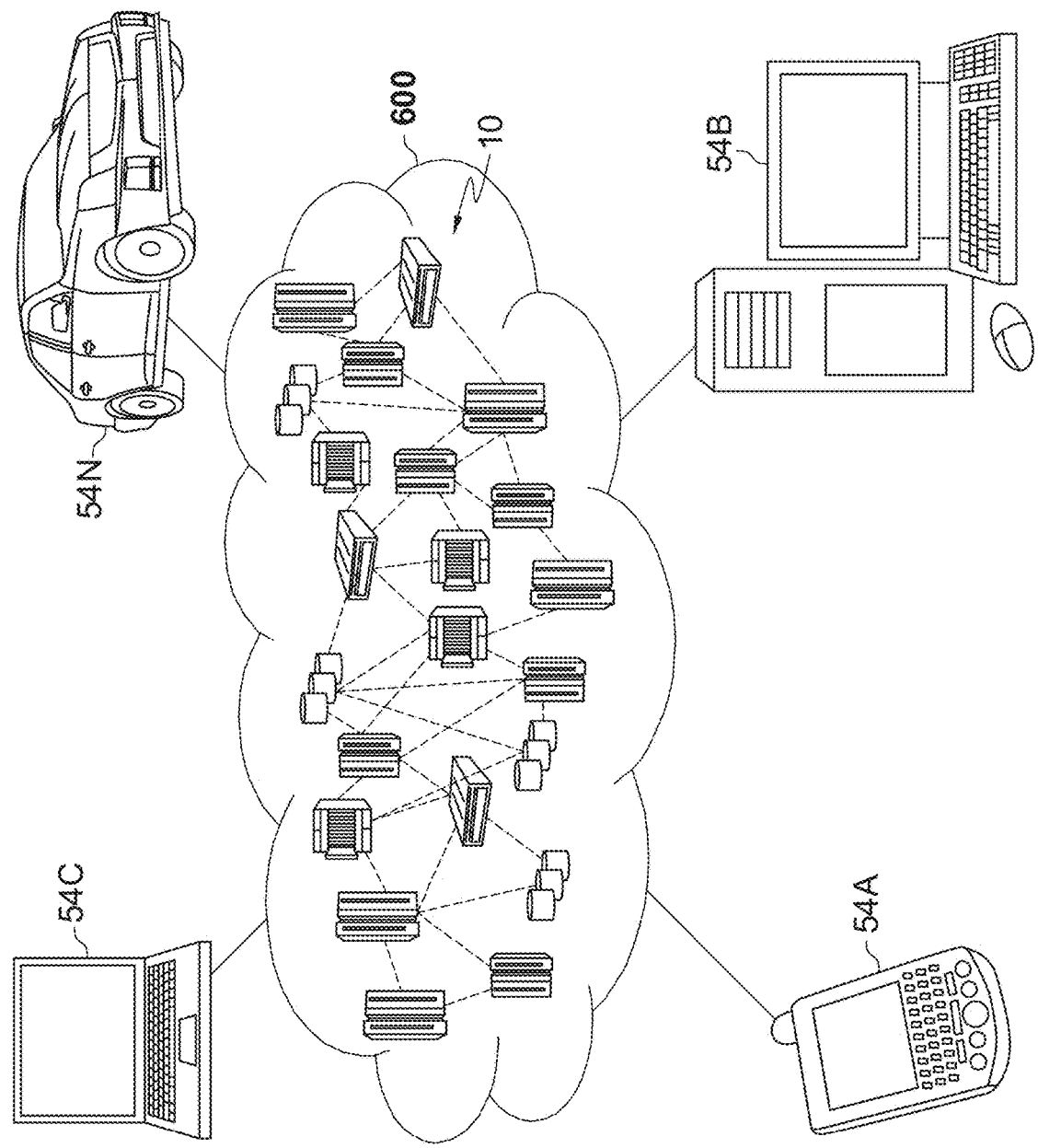
FIG. 6 is a block diagram of an illustrative cloud computing environment including the computer system depicted in FIG. 1, according to at least one embodiment.

Computer 102 (FIG. 1) and server computer 114 (FIG. 1) may include respective sets of internal components 800A,B and external components 900A,B illustrated in FIG. 6. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Fault Detection Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 5, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Fault Detection Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Fault Detection Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Fault Detection Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring to FIG. 6, illustrative cloud computing environment 600 is depicted. As shown, cloud computing environment 600 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 600 to offer infrastructure, platforms and/or software as services for which a cloud consumer does not need to maintain resources on a local computing device. It is understood that the types of computing devices 54A-N shown in FIG. 6 are intended to be illustrative only and that cloud computing nodes 10 and cloud computing environment 600 can communicate with any type of computerized device over any type of network and/or network addressable connection (e.g., using a web browser).

Figure 7:
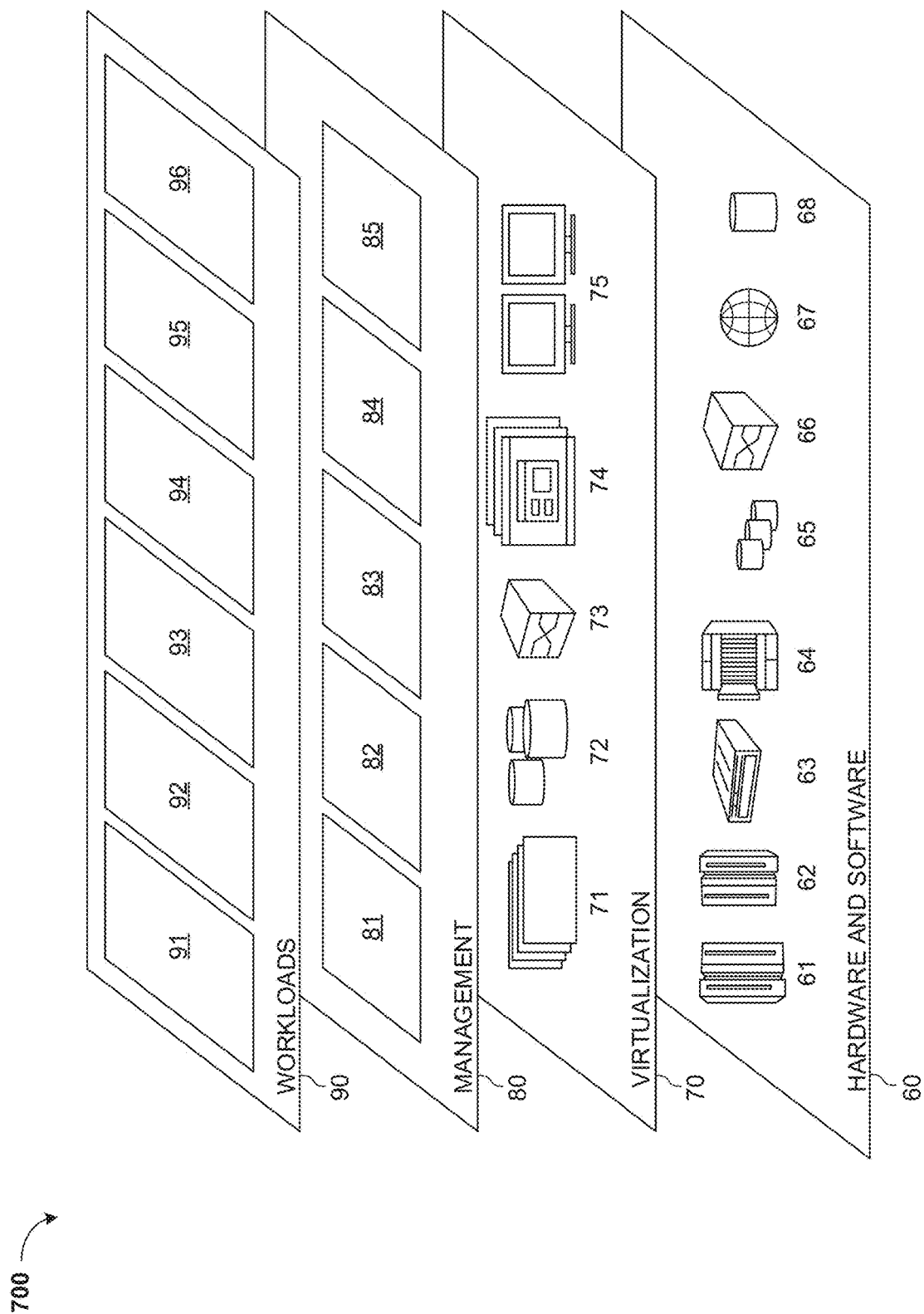
FIG. 7 is a block diagram of functional layers of the illustrative cloud computing environment of FIG. 6, according to at least one embodiment.

Referring to FIG. 7, a set of functional abstraction layers 700 provided by cloud computing environment 600 (FIG. 6) is shown. It should be understood in advance that the components, layers, and functions shown in FIG. 7 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Fault Detection 96. Fault Detection 96 may detect transient, intermittent faults within an electrical network.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of transient fault detection in an electrical network, executable by a processor, comprising:
    determining, based on measuring a fault current for a one half cycle length of discrete sample data, an inductance between a reference point and a fault;
    determining, based on a differential of the fault current being zero for the one half cycle length of the discrete sample data, a resistance between the reference point and the fault; and
    identifying a line inductance and a line resistance of a fault loop associated with the fault based on the inductance and the resistance.

2. The method of claim 1, wherein voltage and the inductance are determined based on a least-squares estimation.

3. The method of claim 2, wherein the least-squares estimation minimizes a weighted sum of the squares of an error value corresponding to a circuit equation associated with the electrical network.

4. The method of claim 2, wherein the least-squares estimation is performed based on a first matrix corresponding to one or more sampled voltages, a second matrix corresponding to one or more sampled currents, and a third matrix corresponding to the resistance and the inductance.

5. The method of claim 4, wherein the resistance and the inductance are determined for the third matrix based on performing a regression on the first and the second matrices.

6. The method of claim 1, wherein based on detecting multiple points where the differential of the fault current is zero, the resistance and the inductance are determined based on a discrete parameter estimation with least-squares.

7. The method of claim 1, wherein the fault corresponds to an intermittent fault.

8. A computer system for transient fault detection in an electrical network, the computer system comprising:
    one or more computer-readable non-transitory storage media configured to store computer program code; and
    one or more computer processors configured to access said computer program code and operate as instructed by said computer program code, said computer program code including:
    first determining code configured to cause the one or more computer processors to determine, based on measuring a fault current for a one half cycle length of discrete sample data, an inductance between a reference point and a fault;
    second determining code configured to cause the one or more computer processors to determine, based on a differential of the fault current being zero for the one half cycle length of the discrete sample data, a resistance between the reference point and the fault; and
    identifying code configured to cause the one or more computer processors to identify a line inductance and a line resistance of a fault loop associated with the fault based on the inductance and the resistance.

9. The computer system of claim 8, wherein the voltage and the inductance are determined based on a least-squares estimation.

10. The computer system of claim 9, wherein the least-squares estimation minimizes a weighted sum of the squares of an error value corresponding to a circuit equation associated with the electrical network.

11. The computer system of claim 9, wherein the least-squares estimation is performed based on a first matrix corresponding to one or more sampled voltages, a second matrix corresponding to one or more sampled currents, and a third matrix corresponding to the resistance and the inductance.

12. The computer system of claim 11, wherein the resistance and the inductance are determined for the third matrix based on performing a regression on the first and the second matrices.

13. The computer system of claim 8, wherein based on detecting multiple points where the differential of the fault current is zero, the resistance and the inductance are determined based on a discrete parameter estimation with least-squares.

14. The computer system of claim 8, wherein the fault corresponds to an intermittent fault.

15. A non-transitory computer readable medium having stored thereon a computer program for transient fault detection in an electrical network, the computer program configured to cause one or more computer processors to:
   determine, based on measuring a fault current for a one half cycle length of discrete sample data, an inductance between a reference point and a fault;
   determine, based on a differential of the fault current as being zero for the one half cycle length of the discrete sample data, a resistance between the reference point and the fault; and
   identify a line inductance and a line resistance of a fault loop associated with the fault based on the inductance and the resistance.

16. The computer readable medium of claim 15, wherein voltage and the inductance are determined based on a least-squares estimation.

17. The computer readable medium of claim 16, wherein the least-squares estimation minimizes a weighted sum of the squares of an error value corresponding to a circuit equation associated with the electrical network.

18. The computer readable medium of claim 16, wherein the least-squares estimation is performed based on a first matrix corresponding to one or more sampled voltages, a second matrix corresponding to one or more sampled currents, and a third matrix corresponding to the resistance and the inductance.

19. The computer readable medium of claim 18, wherein the resistance and the inductance are determined for the third matrix based on performing a regression on the first and the second matrices.

20. The computer readable medium of claim 15, wherein based on detecting multiple points where the differential of the fault current is zero, the resistance and the inductance are determined based on a discrete parameter estimation with least-squares.

* * * * *